United States Patent
Chang et al.

(10) Patent No.: US 7,205,630 B2
(45) Date of Patent: Apr. 17, 2007

(54) METHOD AND APPARATUS FOR A SEMICONDUCTOR DEVICE HAVING LOW AND HIGH VOLTAGE TRANSISTORS

(75) Inventors: Chi-Hsuen Chang, Hsin-Chu (TW); Jun Xiu Liu, Hsin-Chu (TW); Tsung-Yi Huang, Hsin-Chu (TW); Chung-I Chen, Hsin-Chu (TW); Tzu-Chiang Sung, Jhubei (TW); Chih Po Huang, Hsin-Chu (TW); Rann Shyan Yeh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/122,635

(22) Filed: May 5, 2005

(65) Prior Publication Data

US 2006/0006462 A1  Jan. 12, 2006

Related U.S. Application Data

(60) Provisional application No. 60/587,677, filed on Jul. 12, 2004.

(51) Int. Cl.
*H01L 29/00* (2006.01)
(52) U.S. Cl. .................. 257/500; 257/501; 257/506
(58) Field of Classification Search ............. 257/510, 257/501, 500, 506
See application file for complete search history.

(56) References Cited

U.S. PATENT DOCUMENTS

| 6,080,637 A | 6/2000 | Huang et al. |
| 6,784,077 B1 | 8/2004 | Lin et al. |
| 2004/0014281 A1* | 1/2004 | Kim et al. .................. 438/257 |

OTHER PUBLICATIONS

Sallagoity, P., et al., "Analysis of Width Edge Effects in Advanced Isolation Schemes for Deep Submicron CMOS Technologies," IEEE Transactions on Electron Devices, vol. 43, No. 11, Nov. 1996, pp. 1900-1906.

* cited by examiner

*Primary Examiner*—Douglas W. Owens
(74) *Attorney, Agent, or Firm*—Slater & Matsil, L.L.P.

(57) ABSTRACT

Method and apparatus for a semiconductor device including high voltage MOS transistors is described. A substrate is provided with a low voltage and a high voltage region separated one from the other. Isolation regions containing an insulator are formed including at least one formed within one of said wells within the high voltage region. The angle of the transition from the active areas to the isolation regions in the high voltage device region is greater than a predetermined angle, in some embodiments it is greater than 40 degrees from vertical. In some embodiments the isolation regions are formed using shallow trench isolation techniques. In alternative embodiments the isolation regions are formed using field oxide formed by local oxidation of silicon techniques.

21 Claims, 17 Drawing Sheets

METHOD AND APPARATUS FOR A SEMICONDUCTOR DEVICE HAVING LOW AND HIGH VOLTAGE TRANSISTORS

This application claims priority to provisional patent application Ser. No. 60/587,677, filed Jul. 12, 2004, entitled "Method for Controlling High Voltage Device $I_d$-$V_g$ Curve Characteristic by Controlling the STI Transition Angle and Circuit Constructed Thereby", which application is hereby incorporated herein by reference.

TECHNICAL FIELD

The present invention and the various embodiments described generally relate to the fabrication of semiconductor devices including power transistors, and more particularly to fabricating integrated devices which incorporate at least one high voltage lateral DMOS transistor also having an isolation region disposed between a source and a drain region.

BACKGROUND

In the semiconductor art, it is desirable to improve transistor performance even as devices become smaller due to ongoing reductions in device scale. Further, it is desirable to manufacture integrated circuit semiconductor devices that incorporate transistors for low, high and sometimes medium voltage range applications in a single integrated circuit. For example, in the cellphone field it is desirable to use semiconductor devices designed and manufactured for providing logic functions and also including display driver circuitry, such as LCD driver circuitry, in a single integrated circuit ("IC"). While the transistors on such an integrated circuit, often referred to as a "system on a chip" (abbreviated "SOIC" or "SOC" or "SoC") include transistors for logic functions which operate at very low voltages, as low as 1.8 Volts or 2.5 Volts, other transistors fabricated on the same integrated circuit device are designed for high power applications and operate at high voltages, as high as 30 or even 40 Volts from drain to source. These high voltage transistor devices also are capable of carrying far more current than the logic transistors or periphery transistors typically used in digital circuits.

One form of high voltage transistor important in system applications such as cellphones and wireless circuitry is the lateral double-diffused MOS or LDMOS transistor. For example, U.S. Pat. No. 6,265,752 issued Jul. 24, 2001, and assigned to the assignee of the present invention, herein incorporated by reference (the "752 patent") describes lateral DMOS devices formed in epitaxial well regions over an N+ buried layer. The high voltage transistor (or transistors) of the '752 patent has a source formed in a first well region, a gate overlying both the first well region and a second well region of an opposite dopant type, and an oxide formed within the area bounded by the second well and isolating the remainder of the gate from the source formed in the second well. This type of high voltage or power transistor can handle operating voltages of 30, 40 or more volts and is therefore particularly useful for driving displays, as for cellphones with liquid crystal displays (LCDs), for automotive applications, and the like.

In the prior art, a problem which arises particularly with such SOC integrated circuits including both low and high voltage MOS devices in a single piece of silicon substrate is that the high voltage LDMOS transistors fabricated in such devices often exhibit a "hump" or undesirable discontinuity in the Id (drain current) vs. $V_g$ (gate voltage) current-voltage characteristic. This $I_d$-$V_g$ "hump" is an undesirable electrical characteristic and results in less than desirable performance, or even unacceptable performance, in the completed devices. That is, the actual operation of the devices deviates from the expected, and designed for, operation.

In current CMOS SOC technology, shallow trench isolation (STI) is becoming the typical approach to creating oxide isolation regions, which allow various types of transistors to be integrated onto a single device by creating electrically isolated active areas within the silicon substrate. In fabricating highly integrated devices incorporating a variety of types of transistors, these different areas of an integrated circuit may be subjected to asymmetric semiconductor processing steps by masking one region with an oxide, hard mask or photoresist coating, while subjecting another region to different process steps, so that devices with different doping profiles, different dielectric materials, and different etching processes can be produced on a single semiconductor substrate, which becomes one or more integrated circuits. The oxide pattern density, that is the ratio of the amount of active area vs. oxide isolation in a given region of the substrate may also vary for the various device types. Although shallow trench isolation (STI) is rapidly becoming the prevalent isolation method, other isolation methods such as local oxidation of silicon (LOCOS), rapid thermal oxidation or TEOS may also be used to form isolation oxide regions between active areas.

A paper entitled "Analysis of Width Edge Effects in Advanced Isolation Schemes for Deep Submicron CMOS Technologies", by P. Sallagoity, et al., IEEE Transactions on Electron Devices, Vol. 43, No. 11, November 1996, pp. 1900–1906, describes several possible causes for the "hump" in the $I_d$-$V_g$ characteristic. In the paper, simulations of the effects of the abrupt transition angle at the active area/isolation boundaries are studied. The paper concludes that if the transition from a device active area to the oxide isolation region is too abrupt, then for certain devices, a subthreshold current flow in the adjacent transistor increases due to a corner parasitic effect at the transition boundary from the active area to the isolation. That is, as the transistor gate voltage is increased but, before it reaches the designed threshold voltage Vt where source-drain current is to be conducted, subthreshold drain current begins to flow due to a parasitic transistor at the corner of the isolation region. As a result of the parasitic or "corner effect" transistor formed at the transition region in the channel, the device turns on early (before the gate voltage $V_g$ is greater than the device threshold voltage) and the resulting undesired current flow creates the "hump" in the drain current vs. gate voltage characteristic ($I_d$ v. $V_g$ curve). An illustrative plot of the $I_d$-$V_g$ curves for a device exhibiting the "hump" and for a device, which does not exhibit the "hump" in the current-voltage characteristic, is shown in FIGS. 1a and 1b, respectively.

While the abrupt isolation transition may be observed when using any isolation type including field oxide, LOCOS or shallow trench isolation (STI) as the isolation scheme for the oxide, STI trenches form the most abrupt active-area-to-isolation region transition angles and therefore the observed corner effects may be expected to be greater in devices fabricated with this current isolation technology. As mentioned above, STI is rapidly becoming the state-of-the-art isolation scheme.

A need thus exists for a method and apparatus for fabricating a high voltage transistor that has an $I_d$-$V_g$ electrical characteristic without the undesirable subthreshold current problem, or "hump", of the prior art. The high voltage transistors should be manufacturable using semiconductor processes that are compatible with typical semiconductor processes for other device types, so that integrated SoC or SoIC devices may be fabricated including both low voltage and high voltage transistors. The various methods and the apparatus of the present invention address these needs.

SUMMARY OF THE INVENTION

Various embodiments of the present invention provide a novel process and structure for a lateral double-diffused MOS (LDMOS) high voltage transistor using isolation regions with controlled active-area-to-isolation-region transition angles. In a first preferred embodiment of the structure of the invention, a buried layer is provided over a substrate, doped semiconductor wells are formed in an epitaxial layer deposited over the buried layer, isolation regions which may be shallow trench isolation regions or LOCOS regions are formed including one in a semiconductor well which will act as a drain region, gate dielectric and gate electrode material is deposited over the substrate, a patterning step is performed to form a gate electrode overlying a gate dielectric which together overly a channel region in a portion of the drain region well, and contact regions are formed to complete a source region and the drain region. The transition angle for the isolation oxide region formed within the high voltage drain well is different from, and less abrupt, than the transition angle of isolation regions formed elsewhere in the substrate.

In another preferred embodiment, a lateral DMOS transistor is formed. First, a buried layer is provided over a substrate, doped semiconductor wells are formed in an epitaxial layer deposited over the buried layer, LOCOS isolation regions are formed including one in a semiconductor well which will act as a drain region, gate dielectric and gate electrode material is deposited over the substrate, a patterning step is performed to form a gate electrode overlying a gate dielectric which together overly a channel region in a portion of the drain well and another well, and contact regions are formed within the two wells to complete a source region and the drain region. The transition angle for the LOCOS isolation region formed within the drain well is different from, and less abrupt, than the transition angle of isolation regions formed elsewhere in the substrate.

In another preferred embodiment, an integrated circuit is formed that includes high voltage and low voltage transistors. In a region of a semiconductor substrate designated as the high voltage region, an N type buried layer is formed. A semiconductor layer of P type material is epitaxially deposited and covers the N type buried layer. High voltage well areas are defined in the substrate in the high voltage region, and low voltage wells are formed in the substrate in other regions, the wells are N and P type doped so as to form N and P type wells. Shallow trench isolation (STI) regions are formed in the high voltage and low voltage regions, in certain wells of the high voltage region designated as drain regions; the shallow trench isolation has a transition angle that is less abrupt than the isolation transition angle in other regions. Gate dielectric material is deposited over the substrate in both the high voltage and low voltage regions. Gate electrode material is deposited over the substrate, a protective mask is deposited over the electrode, this mask is patterned, and the gate electrode and gate dielectric structure are subsequently completed by an anisotropic etch which extends through the dielectric layer and completes the device gates and the gate dielectric regions. The resulting structure is then processed using conventional steps further to include sidewall spacers and self-aligned source and drain regions to form complete MOS transistors in the low voltage region, the sidewall spacers covering the sides of the gate electrodes including the a portion of the area beneath the bottom of the dielectric layer. The high voltage region receives implants to form a source contact in some wells and a drain contact region in the drain wells. The integrated circuit device is then completed using conventional inter-level dielectric insulation, vias and metallization layers to electrically couple the various devices on the integrated circuit as needed for a particular function.

In a preferred method for fabricating an integrated device using the invention, asymmetric semiconductor processes are used. The isolation regions for the high voltage transistors are formed using an etch process that results in a relaxed transition angle for the isolation trenches while the low voltage region is masked. After the high voltage isolation trenches are formed, the low voltage region of the integrated circuit is exposed and processed using a different etch to form trenches for the isolation regions having a steeper transition angle for the trenches.

Preferred embodiments of the invention have particular application to LCD driver applications such as are used in cellphone, wireless and automotive applications where high voltage transistors and logic function transistors are implemented in a single integrated circuit device.

In another preferred embodiment, a system on a chip (SOC or SOIC) such as an integrated LCD driver device is fabricated which has high voltage transistors with a relaxed transition angle in the isolation regions, and low voltage devices with a steeper transition angle in the isolation regions, preferably the high voltage transistors are formed in a region having isolation oxide transition angles of greater than about forty (40) degrees from the vertical or more, and the lower voltage transistors are formed in a region having oxide transition angles of less than about twenty five (25) degrees from the vertical.

Additional features and advantages and embodiments of the invention will be described hereinafter, which form the subject of the claims of the invention. It should be appreciated by those skilled in the art that the specific embodiments disclosed might be readily utilized as a basis for modifying or designing other structures or processes for carrying out the purposes of the present invention. It should also be realized by those skilled in the art that such equivalent constructions and variations on the example embodiments described do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1a depicts the $I_d$-$V_g$ curves of a device exhibiting the characteristic "hump" of the prior art power devices, while

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The operation and fabrication of the presently preferred embodiments are discussed in detail below. However, the embodiments and examples described herein are not the only applications or uses contemplated for the invention. The specific embodiments discussed are merely illustrative of specific ways to make and use the invention, and do not limit the scope of the invention or the appended claims.

Figure 2:
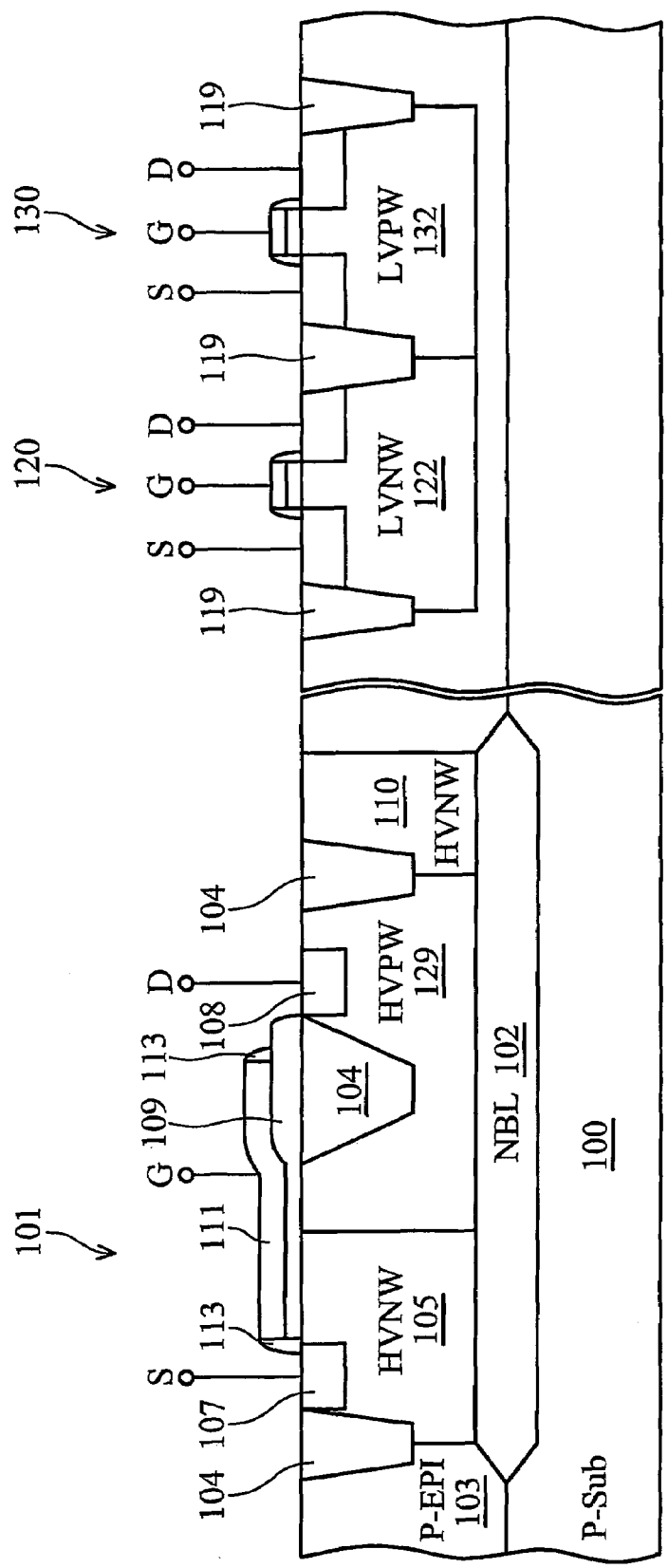
FIG. 2 depicts a cross-sectional view of a portion of a semiconductor substrate having a preferred embodiment including a high voltage LDMOS transistor and a pair of low voltage MOS transistors disposed in separate high and low voltage regions.

FIG. 2 depicts in a simplified cross sectional view, drawn in a representational view and not to scale, a portion of an integrated circuit having a single exemplary high voltage transistor and two exemplary lower voltage transistor disposed in a high voltage and a low voltage region. A practical circuit would have many of each type of transistor, perhaps thousands of each. During fabrication of the devices as described in more detail below, masking including photoresist or nitride hard masks will be used to asymmetrically process the high voltage and low voltage regions when necessary; however, whenever possible a single processing step will be used in both regions. Many process steps will be performed in one or the other regions while the remaining area is protected by a mask or coating. This asymmetric processing technique enables the fabrication of devices with substantially different physical structures such as different dopant concentration, differing oxide and nitride thicknesses, different etches used to achieve various selectivity, and the like. Thus the high voltage devices can have substantially different breakdown and threshold voltages, and current carrying capacities, than the low voltage devices although all of the devices are provided on the same integrated circuit. This asymmetric fabrication process is known to those skilled in the art.

FIG. 2 depicts a cross sectional view of an integrated circuit substrate 100. The substrate may be, for example, a p type semiconductor substrate with a crystal orientation of <100>. As is known to those skilled in the art, other materials may be used including GaAs or other semiconductor types, with various crystal orientations, and the substrate could be a silicon-on-insulator (SOI) substrate. Also, as is known to those skilled in the art, N type substrates can be used and throughout the description instead of the P type substrate of FIG. 2. It is to be understood that either conductivity type P and/or N can be used instead of the one described for a particular structure in the embodiments described herein, as is conventionally known.

Transistor 101 is formed in high voltage wells 105, 129 and 110 that are wells created in, for example, a P type epitaxial layer formed over an N type buried layer 102. The use of the N type buried layer 102 is preferred, however, in an alternative embodiment it may be omitted as is known in the art. Transistor 101 is a high voltage LDMOS device formed in high voltage wells, which are formed by conventional implant steps in the epitaxial layer 103. The typical thickness of epitaxial P layer 103 range is 3~6 microns. The typical high voltage N wells 105 are phosphorous doped at a range from $1 \times 10e12$ to $1 \times 10e13$ atoms per $cm_3$. The typical high voltage P wells 106 are boron doped at a range from $1 \times 10e12$ to $1 \times 10e13$ atoms per $cm^3$. Of course, one skilled in the art will recognize that the high voltage wells can be reversed in doping polarity, that is the N wells 105 could be replaced with P type wells and the P wells 106 could be replaced with N type wells, using conventional steps to produce these wells.

Transistor 101 has a source region 107, a drain region 108, which will be N+ implanted region for the source 107, and a P+ implanted region for the drain 108, and which regions are used to receive contacts (not shown) and which may also be subjected to silicidation steps to lower the sheet resistance of the regions for improved electrical performance (the optional silicide is also not shown). The drain 108 may also comprise one of the shallow trench isolation regions 104. Gate electrode 111 is a polysilicon or metal gate material that may also be silicided for lower resistance, again the silicide is not shown. Gate dielectric 109, which is formed over isolation 104, completes the LDMOS transistor 101. The thickness of gate dielectric 109 is greater than 300 angstroms. The gate overlies one of shallow trench isolation regions 104. Overlap between the gate and one of shallow trench isolation regions 104 is less than about 3 micrometers.

In the high voltage wells for the transistor 101, the shallow trench isolation regions 104 are shown. These will be formed using conventional silicon etch and fill process steps as described below; however, the transition angle from a vertical position will be controlled to improve device performance as will be described in further detail. This transition angle will be created differently from and at a larger angle to the vertical than the isolations in other regions of the device. Also, the substrate surface at the top corner of the shallow trench isolation regions 104 is a rounded shape. Also, the lower surface of isolation dielectric layer at the top corner of the shallow trench isolation regions 104 is positioned below the gate dielectric 109 of the high voltage LDMOS device 101. Also, the top surface height in the shallow trench isolation regions 104 oxide is higher than the interface of the substrate and the gate dielectric 109 of the high voltage LDMOS device 101. The top surface height difference between the shallow trench isolation regions 104 oxide and the interface of the substrate and the gate dielectric 109 of the high voltage LDMOS device 101 is greater than about 50 angstroms. In a second embodiment, the top surface height difference between the shallow trench isolation regions 104 oxide and the interface of the substrate and the gate dielectric 109 of the high voltage LDMOS device 101 is greater than about 100 angstroms. In a third embodiment, the top surface height difference between the shallow trench isolation regions 104 oxide and the interface of the substrate and the gate dielectric 109 of the high voltage LDMOS device 101 is greater than about 500 angstroms. Also, the high voltage region includes a PMOS device, one of the second isolation regions 104 is in the P well of the PMOS device. Also, the high voltage region includes a NMOS device, and one of the second isolation regions 104 is in the N well of the NMOS device.

In a low voltage device region separated from the exemplary high voltage device 101, transistors 120 and 130 are formed using conventional process steps. In the p substrate 100, low voltage N and P wells 122 and 132 are provided. These are electrically isolated one from the other and from other regions of the device by shallow trench isolation regions 119, which will be formed using silicon etch and fill insulation techniques also as described below in detail. Self aligned gate techniques are used to form a gate dielectric which has a thickness of less than 40 angstroms and an overlying gate electrode. The gate electrode may be of a polysilicon, for example, or a metal gate may be used, the gate electrode may be subjected to a silicidation step to reduce the resistance and thereby improve performance. The gate electrode is patterned and used as a self aligned mask for source and drain implants for both a P channel and an N channel device, transistor 120 is a P channel device formed in a N well, and transistor 130 is an N channel device formed in a P well, thus together they form a pair of CMOS transistors which may be connected, for example, if the gates are coupled to a common input they may form a CMOS logic inverter as is known in the art. The gate is further subjected to oxidation to create sidewall spacers of a dielectric such as an oxide or nitride layer to further improve performance and planarization of subsequent layers, not shown. Also, the gate length of the low voltage device 120, 130 is smaller than about 0.2 micrometers.

Shallow trench isolation regions 119 will be similar to the shallow trench isolation regions 104 of the high voltage transistor, except that the transition angle to the vertical at the boundary edges of the shallow trench isolation regions 119 will be steeper, that is the angle to the vertical will be lower, than that of shallow trench isolation regions 104. This structure provides various advantages over the prior art STI regions in a similar integrated circuit as will be further described, including enhanced performance of the high and low voltage transistors.

The methods and processes used to form the structures of the invention will now be described in more detail. The formation of the isolation regions with certain transition angles is of great importance to the invention and the preferred embodiments, and so the process steps used to create the isolation regions will be described in detail. In contrast, the steps and processes used to provide the various wells, the source and drain regions, the dielectric layers, the gate electrodes and the subsequent interlevel dielectric insulation and metallization layers needed to fabricate both the high voltage and low voltage transistors are all conventional semiconductor process steps well known to those skilled in the art; substitution of equivalent approaches or alternative process steps is expected and such variations on the preferred embodiments and methods provided herein are contemplated by the inventors and are within the scope of the invention and the appended claims.

Figure 3:
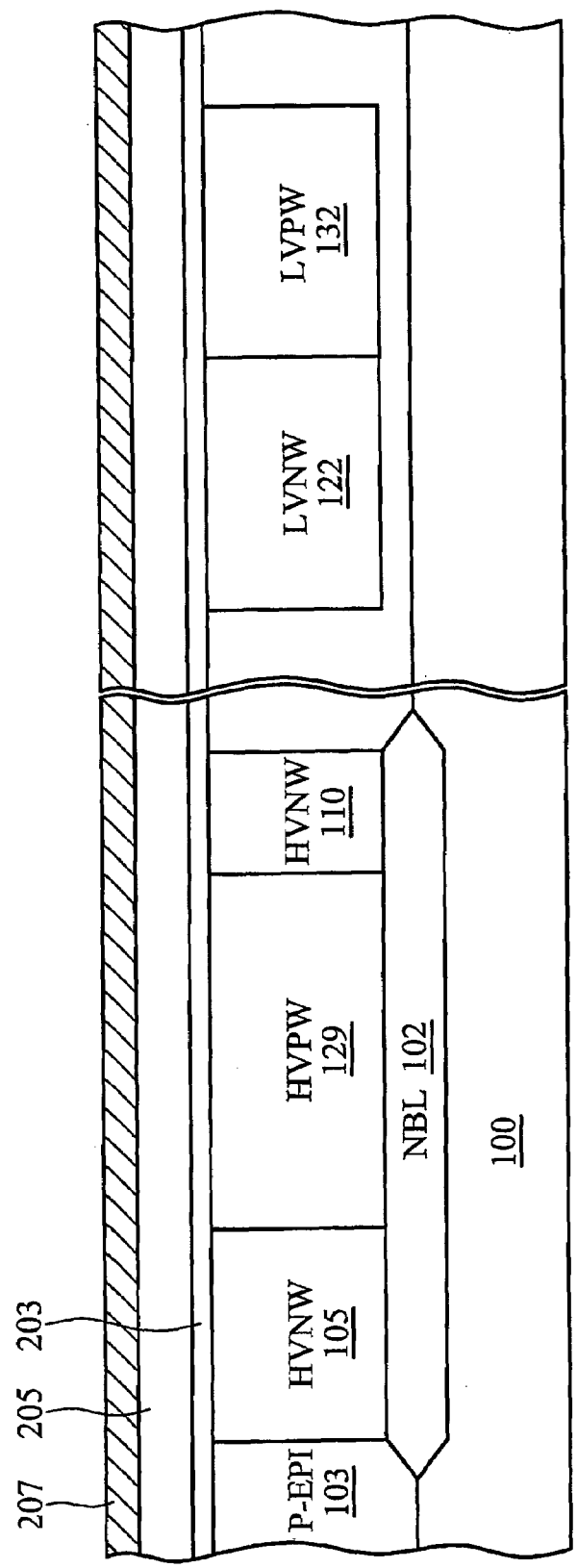
FIG. 3 depicts in cross section a semiconductor substrate including an N buried layer, and epitaxial layer, and wells formed in the epitaxial layer, prior to isolation trench formation.

FIG. 3 depicts semiconductor substrate 100 after some initial conventional semiconductor process steps have been completed, and before the formation of any of the isolation regions. In FIG. 3, substrate 100, a P type substrate or as an alternative a P type semiconductor layer on an SOI substrate, will provide the basic material for the manufacture of the circuit. In prior conventional processing steps, a buried layer 102 which is a N type buried layer has been formed over the substrate, such as is typically used for high voltage devices; for example the '752 patent describes LDMOS transistors formed in wells over a buried layer and an exemplary process which may be used for forming the buried layer and the wells of FIG. 3. A single crystal substrate 100 is provided with a crystal orientation of <100>, the buried layer 102 may be formed by patterning a photoresist mask, diffusing or implanting in an N type dopant such as phosphorous or arsenic and using a thermal process to drive it in, with a resulting dopant concentration of $1 \times 10E19$ or $1 \times 10E20$ atoms/cm$^3$. P type epitaxial layer 103 is subsequently grown or deposited on the N buried layer 102, to provide the top portion of the semiconductor layer, and may have a thickness from 3 to 6 Angstroms. High voltage N wells 105 and 110 are provided and are doped to an N type, high voltage well 129 is provided and doped to a P type, these are formed by ion implantation and thermal diffusion steps. Note that the resulting high voltage P well 129 is isolated by the N wells 105 and 110 and the N buried layer 102.

Likewise, low voltage wells 122 and 132 are provided, and are doped to an N type for 122 and P type conductivity for 132. These wells are formed conventionally using ion implantation and thermal diffusion steps such as are well known in the art.

Substrate 100 is depicted in FIG. 3 with a thin pad oxide layer 203 and a nitride layer 205 deposited over it using typical deposition processes, for example the depositions may be a chemical vapor deposition, a plasma enhanced deposition, or any other blanket deposition known in the art, such as reduced pressure CVD or others. U.S. Pat. No.

6,784,077, to Lin, et al., assigned to the owner of the instant application, and herein incorporated by reference (the "077 Patent") provides an example fabrication process for STI isolation regions. Generally, a pad oxide layer such as layer 203 is formed using a thermal growth technique, followed by deposition of a silicon nitride layer 205. The nitride layer will become a mask layer for a subsequent silicon etch step to form the trenches into the silicon epitaxial layer instead of a photoresist layer, because the chlorine etches typically used would damage or remove a conventional photoresist layer. Following the deposition of the silicon nitride, a photoresist layer is deposited using a coater such as a spin-on coater as is known in the art.

For example, in one preferred embodiment silicon dioxide layer 203 may be grown at a temperature between 900 to 1000 degrees Celsius in an oxygen steam ambient environment, to form a layer of a thickness between 100 and 500 Angstroms, then silicon nitride layer 205 may be formed. Then depositions may be performed using a variety of techniques as is known in the art, for example, in a preferred embodiment chemical vapor deposition or low pressure CVD is used. Alternatively, plasma enhanced vapor deposition or PECVD may be used to form a nitride layer of a thickness between 1000 to 2500 Angstroms. More or less thickness may be used in a given process where the structure invention is fabricated.

Figure 4:
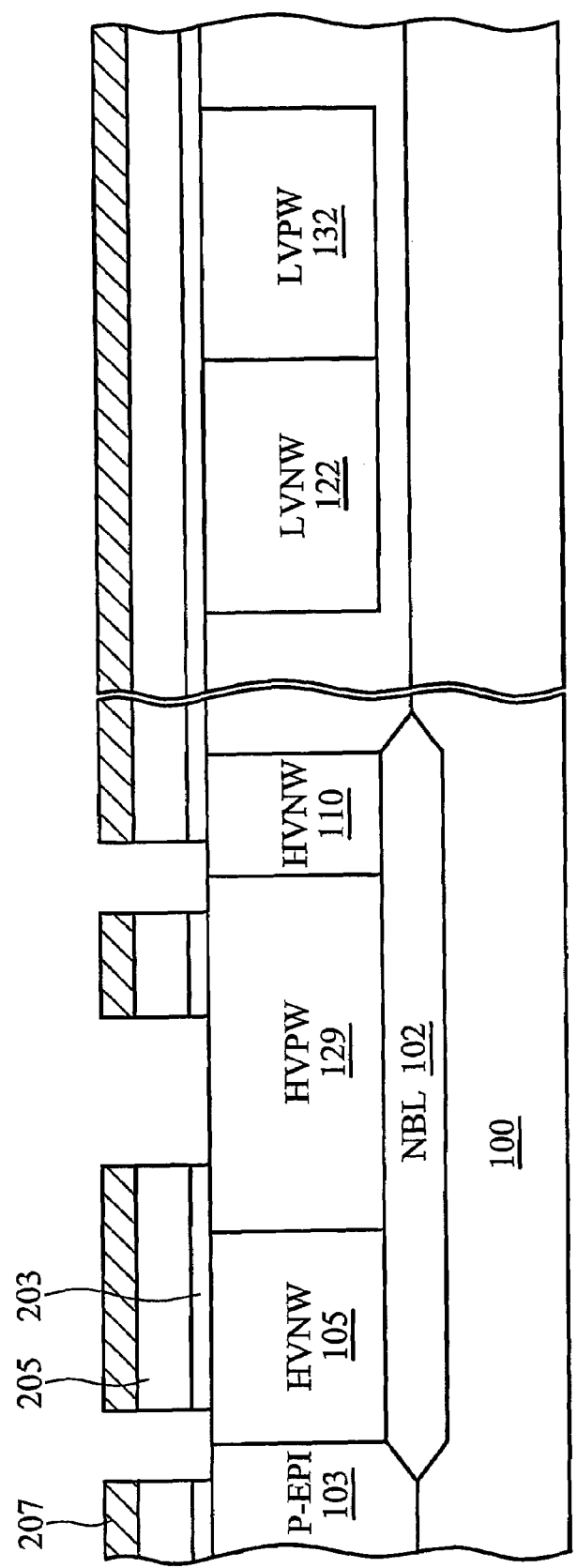
FIG. 4 depicts a cross-sectional view of the substrate of FIG. 3 following the formation of a pad oxide, a nitride, and a photoresist layer which has been patterned and is used as an etch mask.

FIG. 4 depicts the integrated circuit device after the nitride 205 and pad oxide 203 are patterned and etched using photolithography techniques to form a hardmask for silicon etch. To perform the steps required to transition from the intermediate result of FIG. 3 to the structure depicted in FIG. 4, photoresist layer 207 is patterned and used as an etch mask for the nitride etch and the oxide etch that follows. The nitride layer 205 is etched away, for example using anisotropic etch steps such as reactive ion etching (RIE) using Chlorine ($Cl_2$), HBr or $CF_4$ as an etchant for the nitride layer, and typically $CHF_3$ is used as an etchant for the silicon dioxide layer 203. Note that the asymmetric processing for the integration of the high voltage and low voltage devices is used, that is, the low voltage device regions remain coated and protected, the nitride and oxide layers are not removed from these areas. As part of one preferred embodiment of the invention, the silicon etch steps that follow are different for the low voltage and high voltage regions and so they must be done in separate processing steps.

Figure 5:
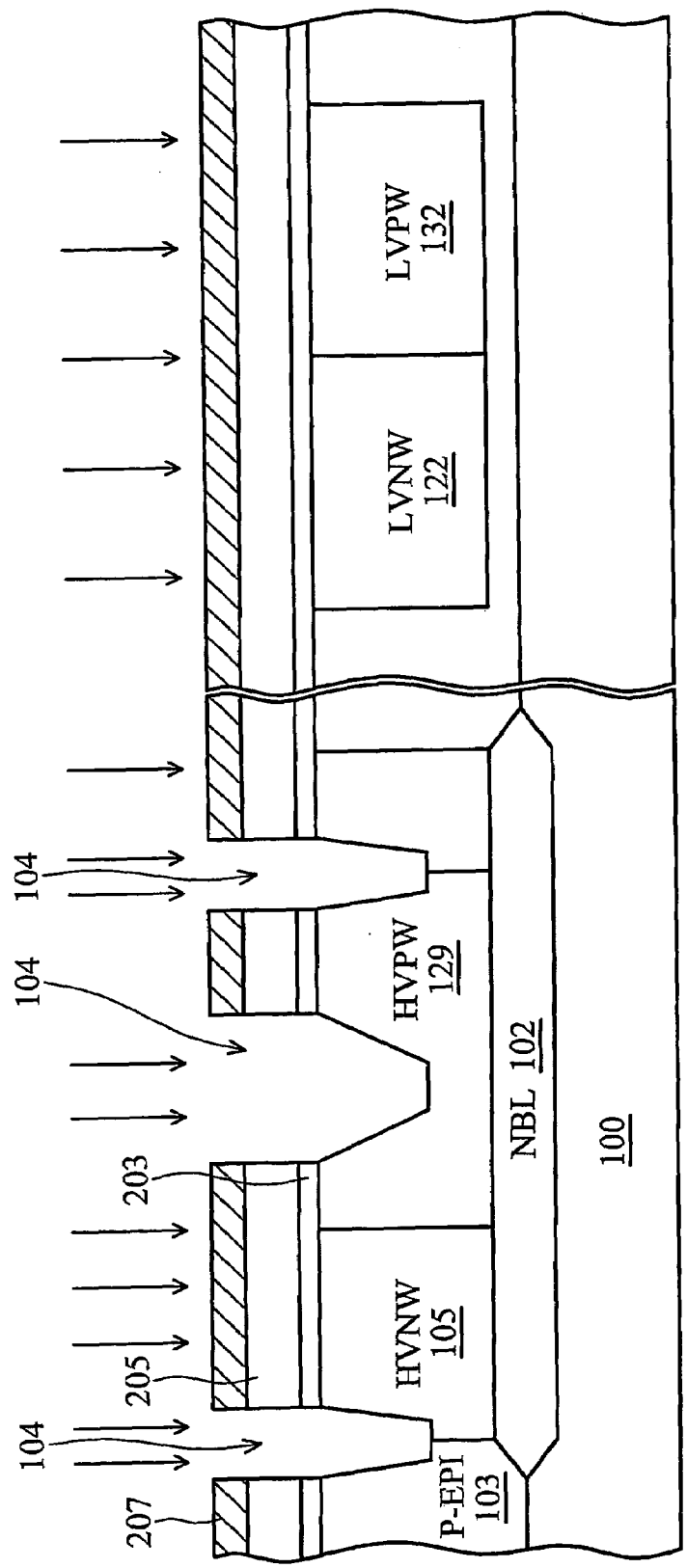
FIG. 5 depicts a cross-sectional view of the substrate of FIG. 4 following the trench formation by etching in the high voltage region.

FIG. 5 depicts the integrated circuit device after the silicon etch process step for the high voltage region only. Silicon etch is typically performed using for example chlorine ($Cl_2$) gas in an anisotropic etch process using RIE etching in a process chamber. As one possible alternative, $SF_6$ may be used as the active etchant. By varying the amount of the active etchant used, it has been determined that the slope of the sidewalls of the trenches may be controlled. In a preferred embodiment, to fabricate a high voltage LDMOS transistor without the $I_d$-$V_g$ characteristic "hump" of the prior art, it has been determined that if the transition angle between the sidewall and a vertical reference line is greater than about 40 degrees, better results are obtained. In a preferred method, the process required to control the transition angle may be determined by varying the etchant recipe and process parameters for a given process and oxide pattern density, and then measuring the transition angle of the resulting trenches. Alternatively, a variety of methods may be used including the so-called "sidewall taper" step of following a first anisotropic silicon etch with a second more isotropic etch such as is obtained with higher pressure used in the RIE chamber, which will soften the slope of the sidewalls from a first steeper angle to a less steep angle, as is known in the art. Other methods could be used to adjust or control the transition angle.

Figure 6:
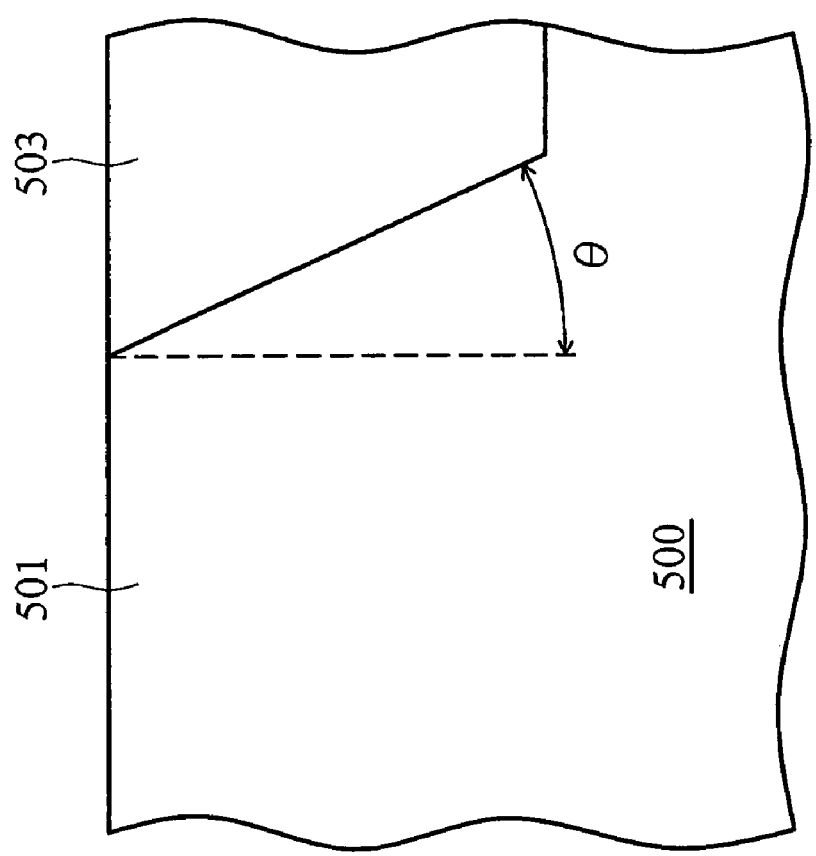
FIG. 6 depicts a typical cross sectional view of a substrate having an isolation region and the transition angle of the isolation region.

FIG. 6 illustrates a transition angle as described herein for ease of understanding. In FIG. 6 a semiconductor substrate 500 is depicted with a surface. Substrate 500 is shown with an active area 501 to the left side and a shallow trench isolation region 503 to the right side, a vertical reference line is depicted in dashed fashion and the transition angle θ is depicted as the angle formed between the sidewall surface of the trench isolation region 503 and the vertical reference line. This angle θ of FIG. 5 is the feature referred to as the "transition angle" for the isolation region in this specification and the appended claims. Generally, in the embodiments of the invention, the desired structure is that the transition angle in the high voltage regions is less abrupt, that is greater, than the transition angle of the isolation regions in the low voltage regions.

Figure 7:
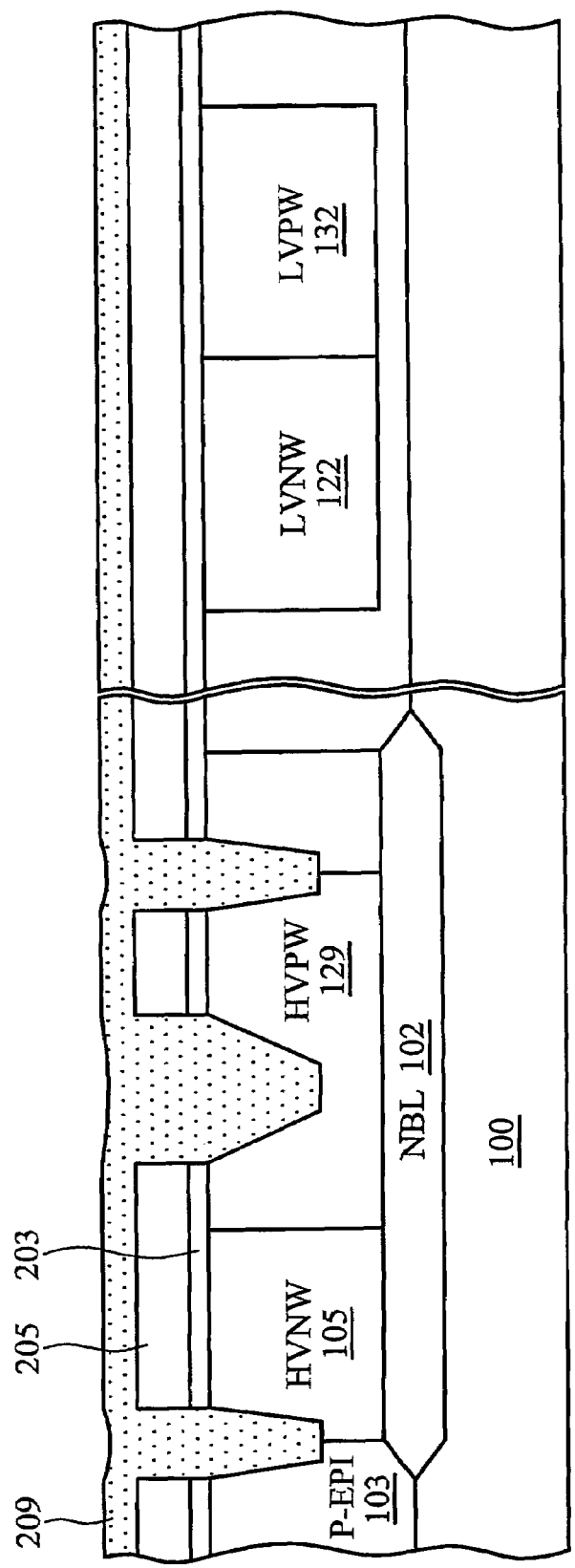
FIG. 7 depicts a cross-sectional view of the substrate of FIG. 5 following deposition of a trench filling insulator in the trench isolation regions of FIG. 5.

Returning to the fabrication process, FIG. 7 depicts the substrate at the next intermediate step. Following the silicon trench formation, the photoresist coating 207 is removed; typically this is done by a plasma oxygen ashing. The trenches in the high voltage area will now be filled with a chemically vapor deposited (CVD) or high density plasma deposited (HDP) insulator, which is typically an oxide. Other intermediate steps may be performed without impairing the use of the invention, for example, the '077 patent incorporated above describes additional steps to form a liner in the trenches and thereby improve the isolation regions, this may be done with the invention of this application as well. The trench oxide 209 is deposited to a thickness of from about 5000 to 8000 Angstroms, completely filling the trenches and overlying the nitride layer 205 as shown in FIG. 6. In another preferred embodiment, the high voltage and low voltage trenches are etched at the same time. Also, the following oxide deposition and CMP processes are performed simultaneously for the high and low voltage regions. The trench etch and deposition oxide thickness is as used typically. The key point of this invention is to adjust the etch recipe so the high voltage area and low voltage area trench transition angles can meet their different requirements.

Following the oxide fill for the high voltage trenches, it is still necessary to form the trenches in the low voltage region. Because a different transition angle is desirable in the low voltage regions, in one embodiment, first a CMP step or similar process is used to remove the excess fill oxide 209 from the low voltage region, while leaving the nitride hardmask 205 in place. As described above, it is also possible to perform the steps so that the high voltage trench and low voltage trench areas are etched at the same time.

Figure 1A:
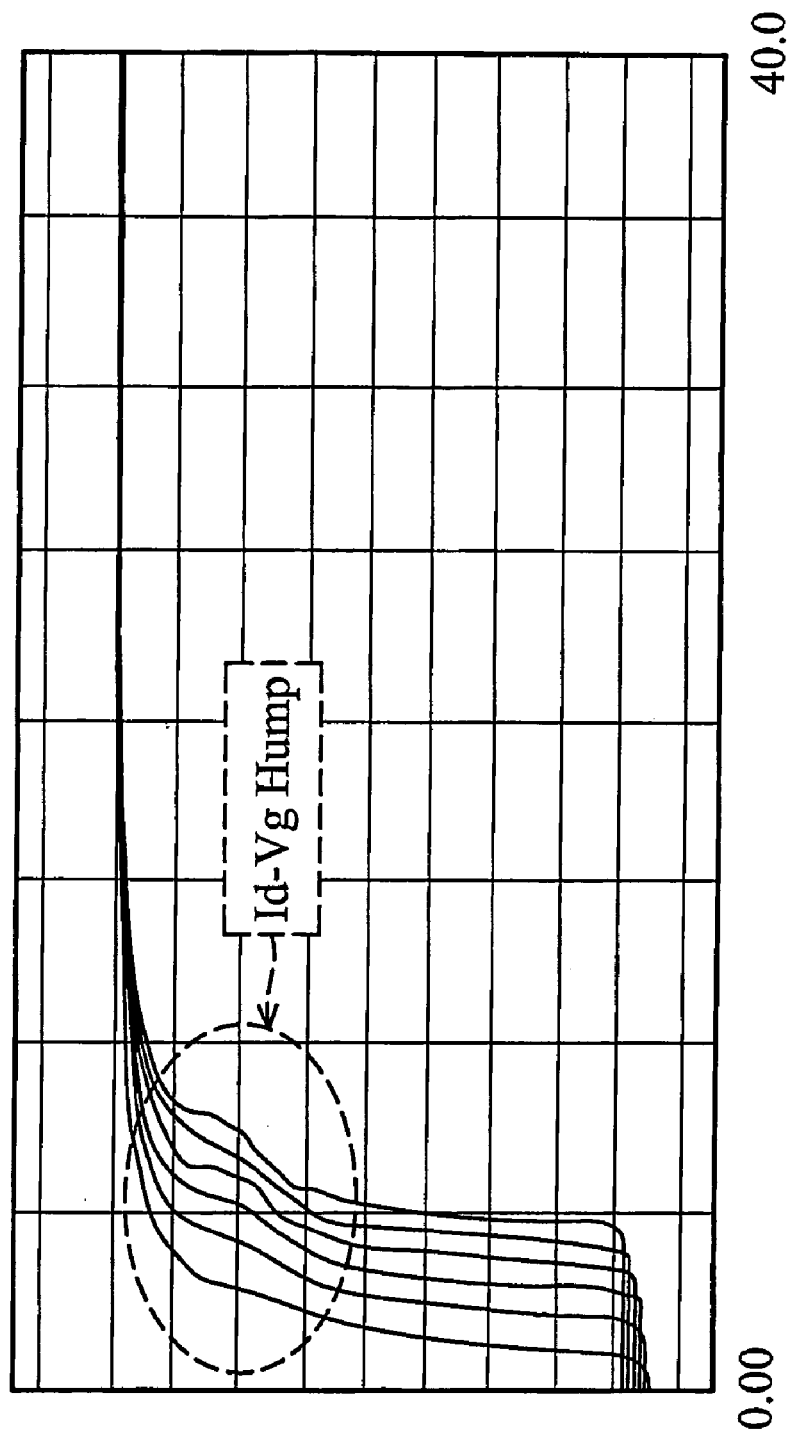
Figure 1B:
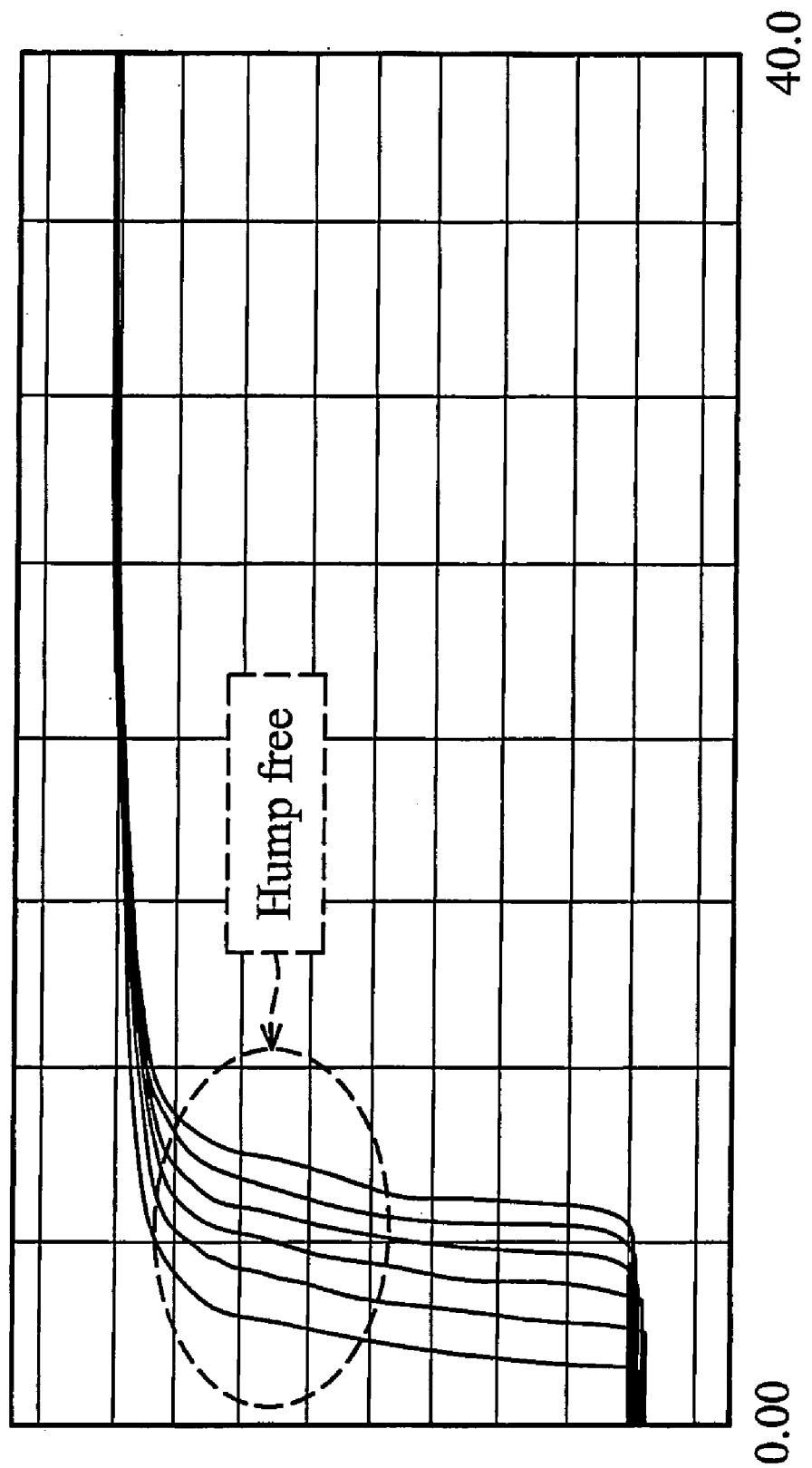
FIG. 1b depicts the curves of a device which does not exhibit the $I_d$-$V_g$ hump.
Figure 8:
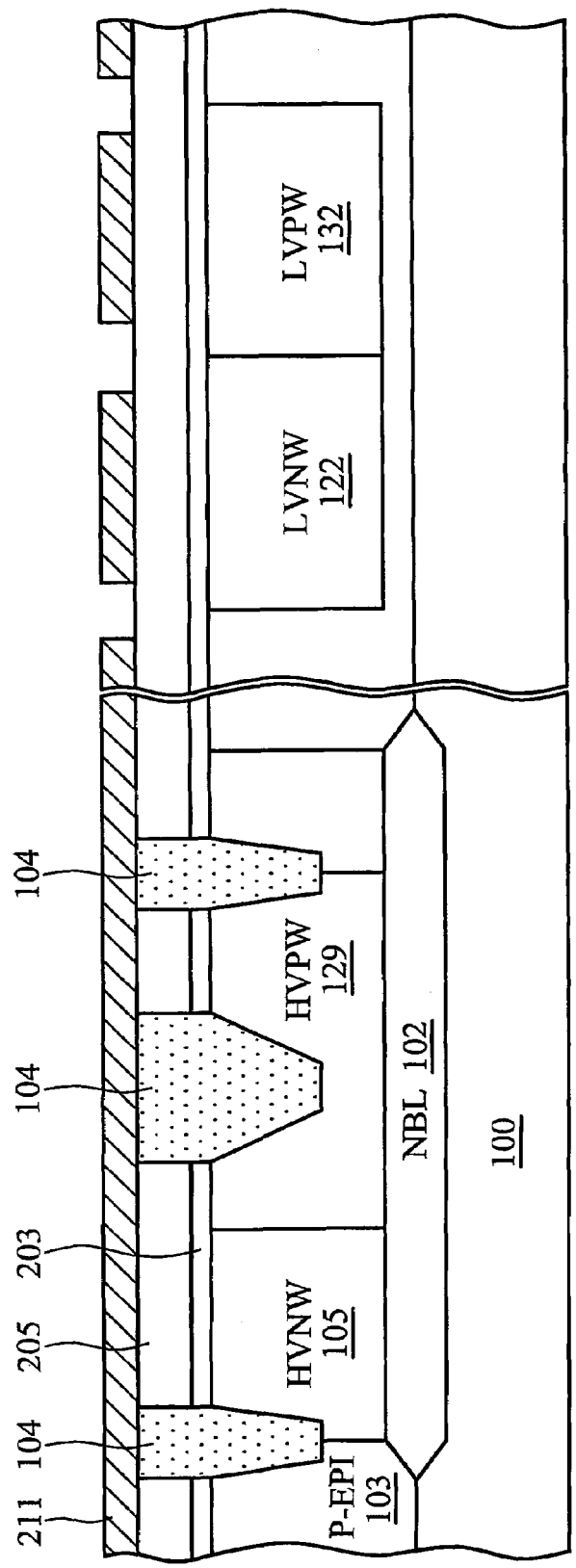
FIG. 8 depicts a cross-sectional view of the substrate of FIG. 7 following the completion of the shallow trench isolation regions in the high voltage region and following the deposition of another layer of photoresist over the substrate.

FIG. 8 depicts the next intermediate step in the process of fabricating the integrated circuit of FIG. 1. Chemical mechanical polishing (CMP) is performed across the substrate 100 and the fill oxide is planarized and removed from all areas outside of the trenches 104 in the high voltage region. Photoresist 211 is then spin coated on the substrate and it is photo patterned to form a mask for the isolation trench formation in the low voltage region, while the high voltage region remains coated and protected as depicted in FIG. 7.

Figure 9:
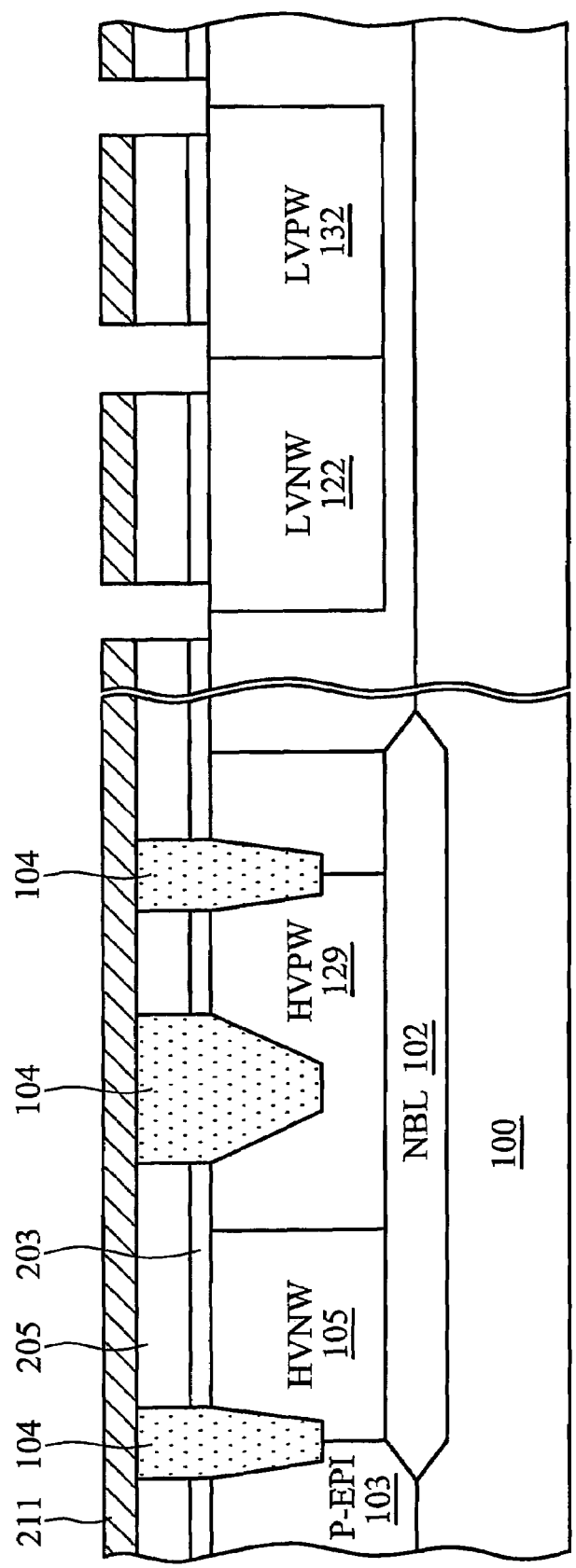
FIG. 9 depicts a cross sectional view of the substrate of FIG. 8 following an etch step to form the isolation regions in the low voltage region of the substrate.
Figure 10:
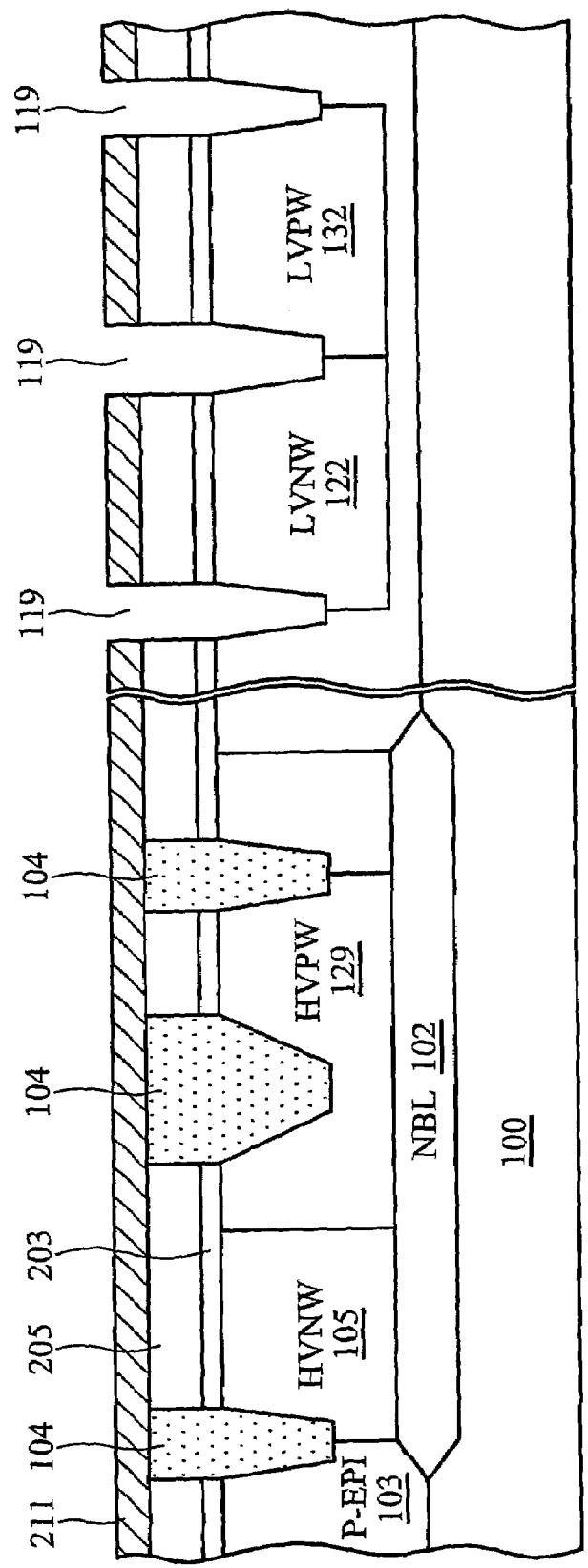
FIG. 10 depicts a cross-sectional view of the substrate of FIG. 9 following the formation of isolation trenches in the low voltage region.

FIG. 9 depicts the substrate 100 after the silicon nitride 205 and silicon oxide 203 are removed from the low voltage region. Again, the nitride and oxide etch is done by conventionally known processes for each type of layer, the nitride is removed by anisotropic RIE etching using chlorine ($Cl_2$) or carbon tetraflouride ($CF_4$) as an etchant, the pad oxide is then etched using $CHF_3$ as the etchant. In the example of FIG. 9, three openings are formed to create an etch mask for three isolation trenches to be formed in the low voltage region. Again the silicon etch process used to etch the trenches 119 in the low voltage regions as depicted in FIG. 10, however, the etch recipe is varied. For the low voltage region, the pattern density is typically higher than in the high voltage regions, and the considerations are different than for the high voltage transistor, so conventional anisotropic etch with a heavier chlorine ($Cl_2$) concentration may be used to achieve a steeper sidewall profile with an isolation transition angle θ that is much lower than that for the high voltage transistor, for example it might be as low as 0 degrees and generally will be less than 25 degrees.

In one preferred embodiment of an integrated process for fabricating low, medium and high voltage transistors, it has been determined that the best performance is achieved for all of the devices when the transition angle for the isolation regions in the high voltage area is greater than about 40 degrees, and when the transition angle in the low and medium voltage regions isolation trenches is less than that, and preferably when the difference between the transition angle in the high voltage region and the low voltage regions is about 25 degrees or larger. These preferred embodiments are all achieved using conventional process steps, however in the preferred embodiments of the invention the isolation trenches for the high voltage regions and the isolation trenches for the low voltage region are created using different etch recipes to insure the transition angles are controlled and within the ranges desired.

Figure 11:
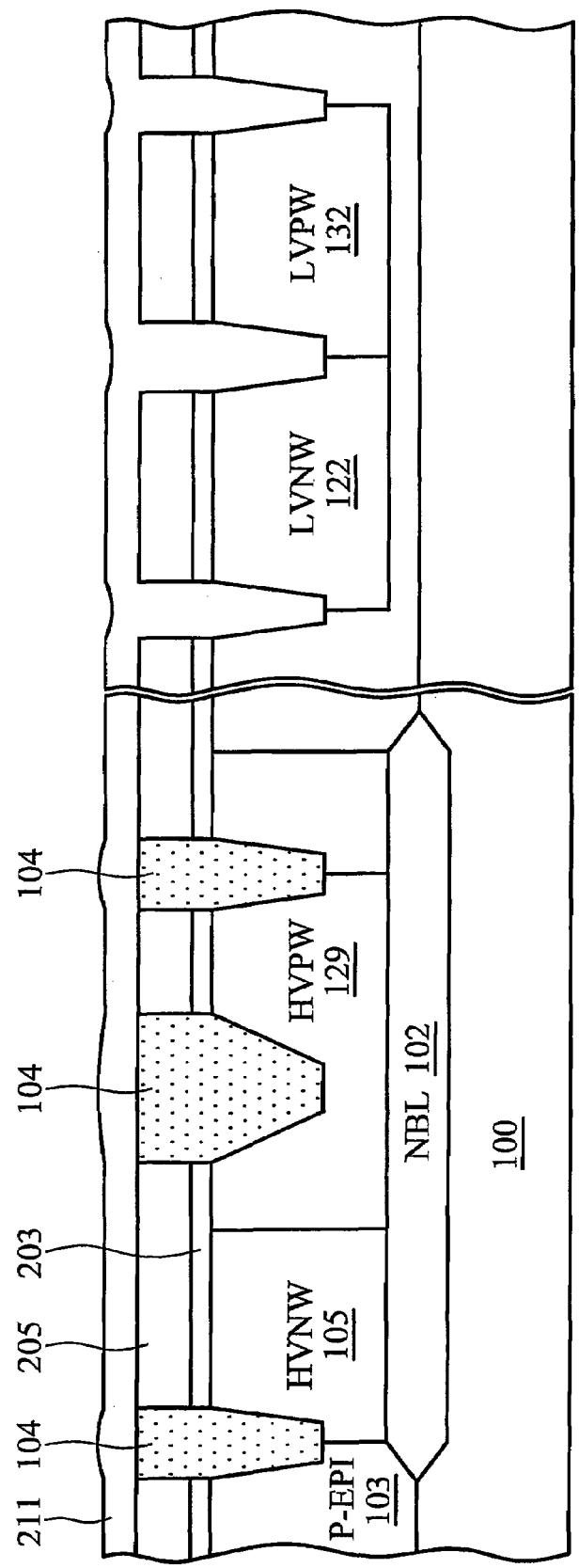
FIG. 11 depicts a cross-sectional view of the substrate of FIG. 10 following the deposition of a fill insulator in the shallow trench isolation regions of the low voltage region.

FIG. 10 depicts the substrate 100 after the STI regions are completed in both the high and low voltage areas. In FIG. 11, the photoresist layer 211 has been removed, again by conventional means such as plasma ashing, and the oxide 214 for the isolation regions in the low voltage areas had been deposited, for example using CVD or high-density plasma deposition, to completely fill the isolation trenches 119. As before, the deposited fill oxide 214 again overlies the nitride layers and the previously formed oxide layers.

Figure 12:
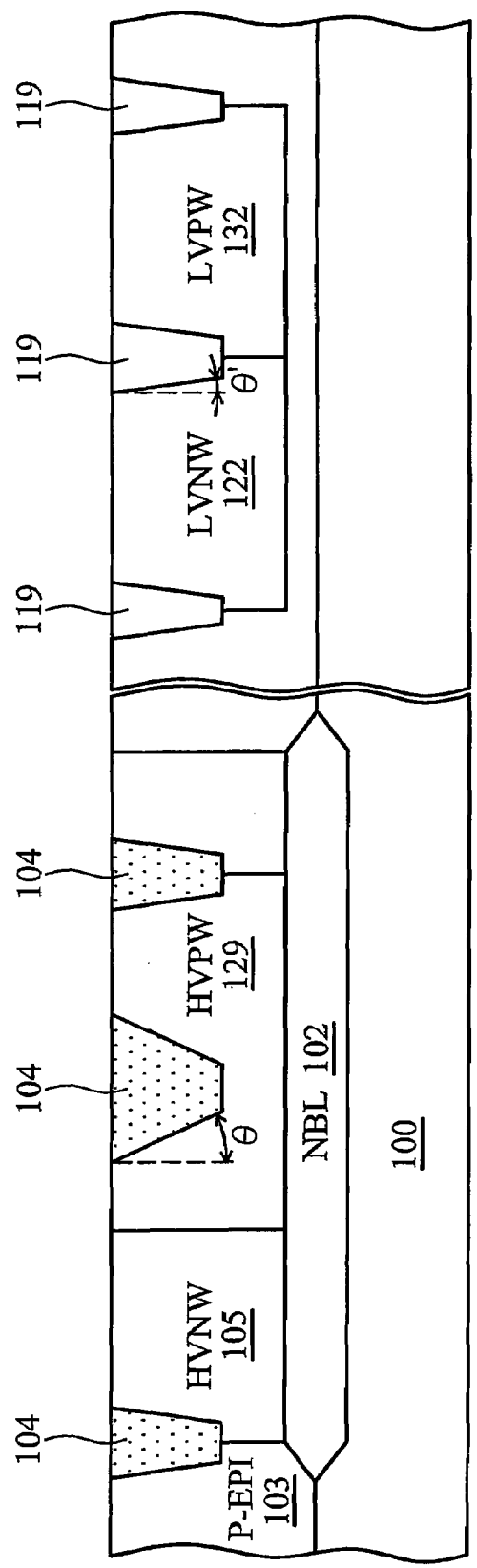
FIG. 12 depicts a cross-sectional view of the substrate of FIG. 11 following the completion of the shallow trench isolation regions in the high and low voltage regions of the substrate.

Following oxide deposition a conventional CMP process issued to remove the oxide from the surface of the substrate, and now as depicted in FIG. 12 the shallow trench isolations are completed in both the low voltage and high voltage regions by continuing the CMP to remove the nitride hardmask and the pad oxide layer to complete the isolations in the substrate. The trenches may be about 1000–5000 Angstroms deep or more or less, in an example the completed STI trenches were 2000 Angstroms deep. The trench as etch depth are around 3000 to 8000 A. After finished complete process flow, the final trench depth range is around 1000 to 6000 A.

The angle θ of FIG. 12 depicts the transition angle of the shallow trench isolation regions 104 in the high voltage region, which is preferably greater than about 40 degrees. The angle θ' in FIG. 11 depicts the transition angle for the shallow trench isolation regions in FIG. 11, which is preferably less than that of θ, and in a preferred embodiment may be less than about 25 degrees.

The preferred embodiment then includes a high voltage region with isolation oxide regions which exhibit a transition angle measured from the vertical that is greater than about 40 degrees, while in a low voltage region the isolation oxide regions exhibit a transition angle that is less than the transition angle in the high voltage regions, and is preferably less than about 25 degrees. The difference between the two angles in one preferred embodiment is greater than about 25 degrees.

While certain steps and exemplary processes were described above, any changes or alternatives to the ones described in the exemplary steps are contemplated as part of the invention described. For example, in the steps described above, separate photolithography steps were performed to form a mask for the nitride etch, the oxide etch and the silicon etch in the high voltage and low voltage regions; it is possible to combine these photolithography steps into a single step. Also, separate nitride etch and the oxide etch steps were performed to form a hardmask for silicon etch in the high voltage and low voltage regions; it is possible to combine these etch steps into a single step. Also, separate silicon etch steps were performed to form the trenches in the high voltage and low voltage regions; it is possible to combine these etch steps into a single step. Also, separate fill oxide depositions were performed to fill the shallow trench isolation regions in the high voltage and low voltage regions; it is possible to combine these depositions into a single step. Also, the steps described above form the trenches in the high voltage regions first, and then the low voltage regions, but that is not required, any order of processing steps may be used and many variations would be contemplated as part of the invention.

Returning to FIG. 2, which depicts the completed structure, the remaining process steps needed to transition from the completed shallow trench isolation structure of FIG. 12 to the completed integrated circuit of FIG. 2 are all conventional steps and familiar to those skilled in the art, and so these process steps need not be provided here. Asymmetric process steps are still used where needed, for example, the gate oxide thickness of high voltage transistor 101 may be as much as 1000 Angstroms, the gate dielectric thicknesses of the low voltage transistors 120 and 130 may be much less and so different depositions may be done for the gate oxide in those two regions. The source and drain implants and the gate electrodes may differ in concentration and depth for the two regions, etc. Photoresists formed using masks and conventional steps to deposit nitrides, and oxides, will be used to form coatings to mask the high and low voltage regions, one from the other, when asymmetric processing is performed so as to enable the integration of the two types of devices in a single process flow.

FIG. 12 depicts one preferred embodiment of a structure of the invention including shallow trench isolation (STI) in the high voltage and low voltage regions. However, a second preferred embodiment might be fabricated using a LOCOS (local oxidation of silicon) approach to form the isolation oxide regions, again while controlling the transition angles from the active areas to the isolation regions so that the transition angle for the high voltage device isolation is greater than the transition angles for the low voltage devices. This embodiment will now be described and depicted in more detail.

Figure 13:
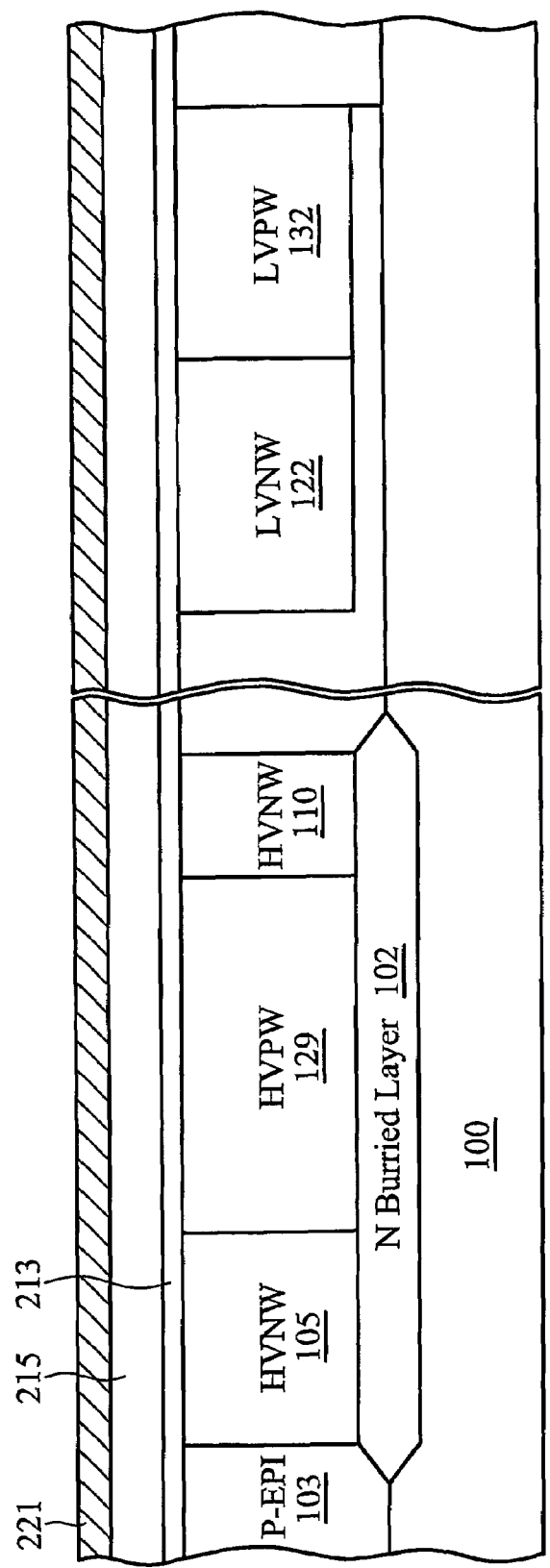
FIG. 13 depicts a cross-sectional view of another substrate to depict the steps to form another preferred embodiment which illustrates the invention used with isolation regions formed using oxides formed using localized oxidation of silicon (LOCOS)

FIG. 13 depicts substrate 100 after an epitaxial layer 103 is formed over the buried layer 102, and the high voltage and low voltage wells, N wells 105, 110 and P well 129 in the high voltage region, and N well 122 and P well 132, in the low voltage region are formed. In FIG. 13, a pad oxide is formed over the substrate and a nitride layer is formed which will be used as an oxidation mask, photoresist layer 221 is formed over the pad oxide 213 and the nitride and photoresist 221 is patterned to provide an etch mask for nitride layer 215.

Figure 14:
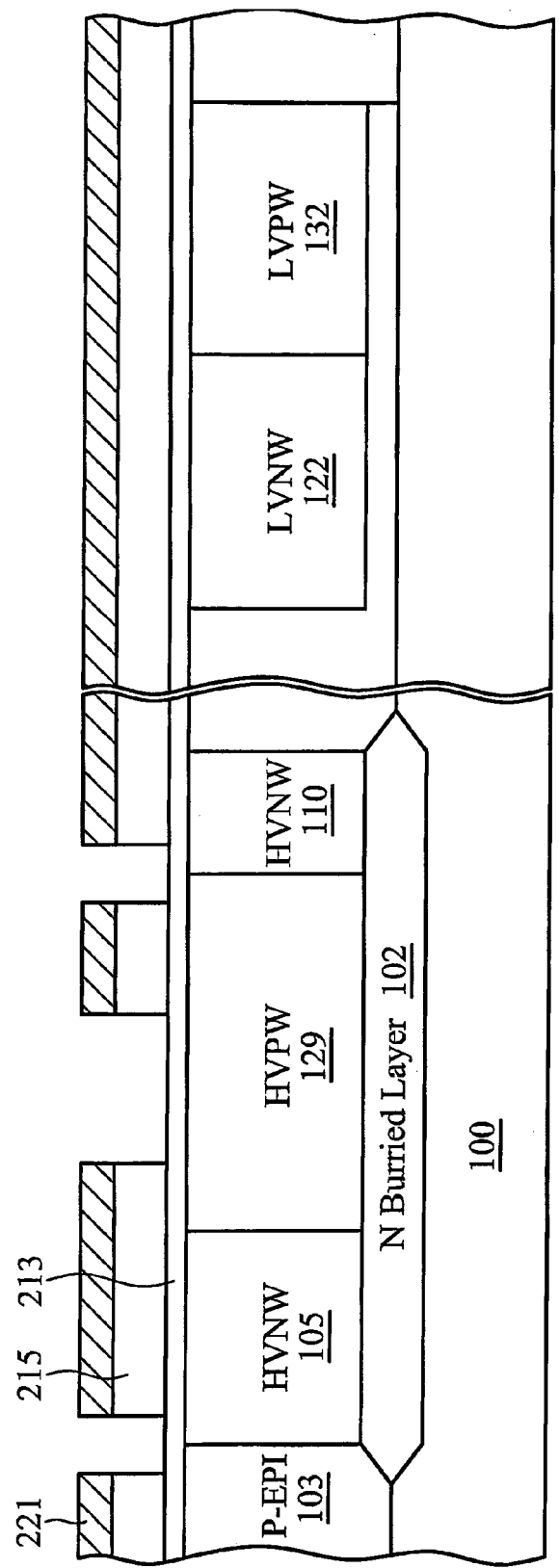
FIG. 14 depicts a cross-sectional view of the substrate of FIG. 13 following another processing step to form the pad oxide, nitride and following an etch step to pattern the oxide and nitride in a high voltage region.

FIG. 14 depicts the device 100 following the silicon nitride etch step. As before the nitride is anisotropically removed, this time; however, the thin layer of pad oxide 213 is left for the LOCOS oxidation step to follow. Again, as the low voltage region containing low voltage N well and low voltage P well 122, 132 is to be processed separately to allow for control of the isolation region transition angles, this area remains covered with nitride layer 215.

Figure 15:
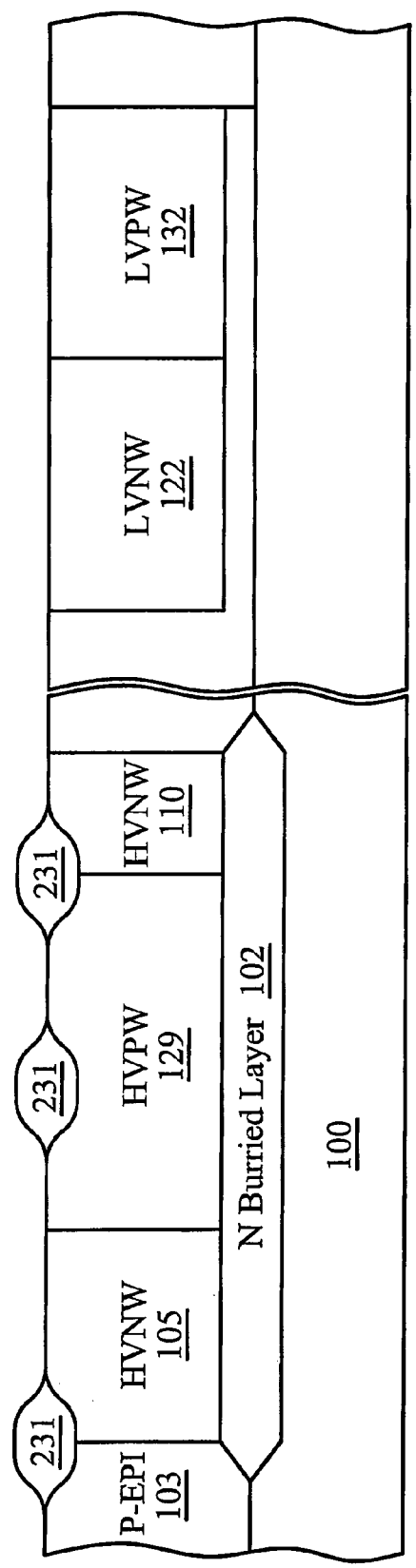
FIG. 15 is a cross sectional view of the substrate of FIG. 14, following the formation of LOCOS isolation regions in the high voltage device region.

FIG. 15 depicts the structure of FIG. 14 following the LOCOS process step in the high voltage region to form isolation regions. In an exemplary embodiment, the photoresist layer 215 is removed and after a clean up step, the substrate is exposed to a thermal oxidation process in oxygen ambient, for example, to form the LOCOS regions 231 in FIG. 15. The field oxide thus formed might be 3000–8000 Angstroms thick, and as is known in the art, consumes some of the silicon beneath it and so the regions extend into the substrate. Following the oxidation process, the silicon nitride and pad oxide layers are removed by using typical processes, such as a hot phosphoric solution to remove the nitride, and a diluted HF or buffered oxide etch (BOE) dip to remove the pad oxide layer. In another preferred embodiment, the high voltage and low voltage area LOCOS are formed with one oxide definition mask, as described before for STI case.

Figure 16:
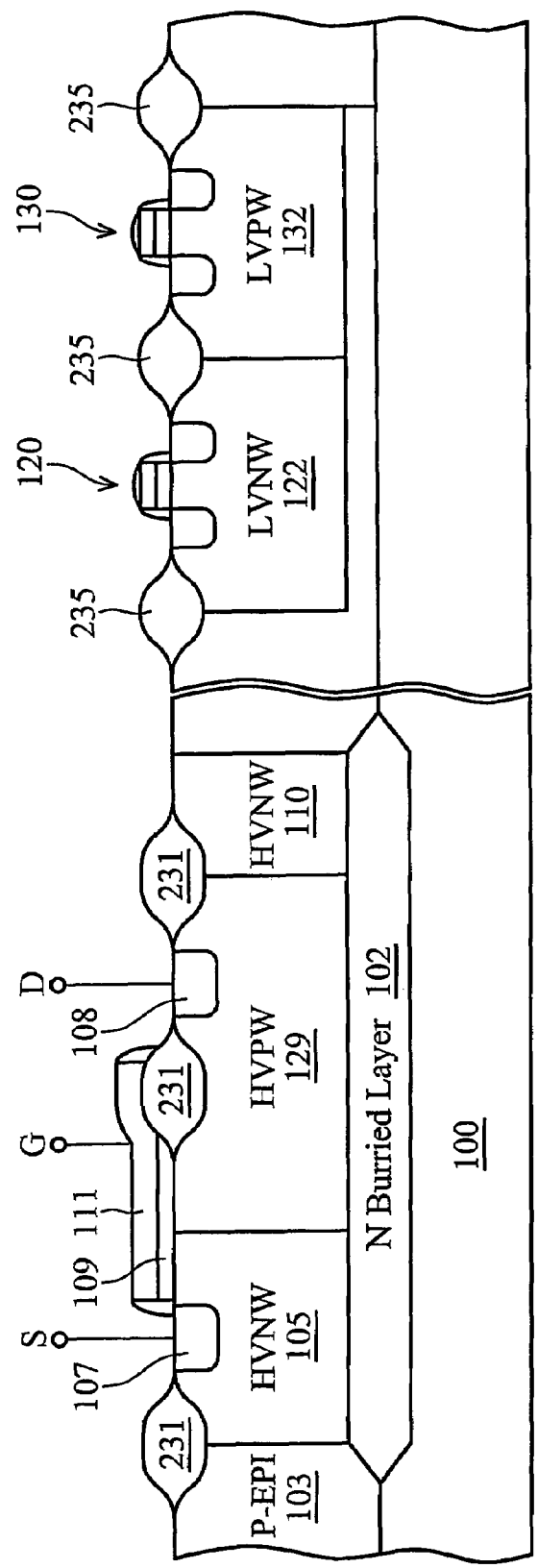
FIG. 16 is a cross sectional view of the substrate of FIG. 15, following the formation of LOCOS isolation regions in the low voltage device region and following the remaining process steps needed to complete the high and low voltage transistors.

FIG. 16 depicts the substrate 100 at the completion of the LOCOS oxidation for both the high voltage and low voltage regions. The steps required to transition from the structure of FIG. 15 to the completed isolation structure of FIG. 16 are again asymmetric processing steps, this time the high voltage region is protected by a silicon nitride oxidation mask, while the low voltage region receives the LOCOS process. The two isolation LOCOS processes, one for the high voltage region of P and N wells 105, 129 and 110, and another separate LOCOS step for the N and P wells 122, 132, are performed under controlled conditions so that the transition angles for the isolation oxide in the high voltage region is greater than about 40 degrees, and is typically greater than 45 degrees as before; while in contrast the transition angle for the low voltage transistors are steeper, that is the angles are lower and may be as less than about 25 degrees, such that the difference between the transition angles in the high voltage region and the low voltage regions may be 25 degrees or greater. The edge transition angle for LOCOS isolation is shallower than for STI isolation in the general case. In this invention, for the LOCOS isolation, the edge transition angle must be greater than 40 degrees. This angle may be controlled by adjusting the pad oxide and pad nitride thicknesses to determine the final "bird beak" length. The transition angle for the low voltage region, in contrast, is less. Again in a preferred embodiment the transition angle for the low voltage region may be between 0 and 25 degrees and the difference between the two angles may be about 25 degrees.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
a semiconductor substrate;
first isolation regions formed into said substrate in a low voltage device region and having sidewalls, the angle between the sidewalls of the isolation regions and vertical at the top portion of the sidewalls where the first isolation region intersects the surface of said substrate being a first transition angle; and
second isolation regions formed into said substrate in a high voltage device region and having sidewalls, the angle between the sidewalls of the second isolation regions and vertical at the top portion of the sidewalls where the second isolation region intersects the surface of said substrate being a second transition angle which is greater than said first transition angle.

2. The semiconductor device of claim 1, and further comprising:
at least one high voltage transistor device formed in said high voltage device region having a source region, a drain region and a gate region, wherein said gate region overlies one of said second isolation regions, wherein said drain region comprises one of said second isolation regions.

3. The semiconductor device of claim 2, wherein the distance the gate region overlies the one of said second isolation regions is smaller than 3 micrometers.

4. The semiconductor device of claim 2, wherein said gate region comprises gate oxide, wherein thickness of said gate oxide is larger than 300 angstroms.

5. The semiconductor device of claim 1, wherein said second transition angle is greater than about 40 degrees.

6. The semiconductor device of claim 1, wherein the difference between said first and second transition angles are greater than about 25 degrees.

7. The semiconductor device of claim 1, wherein said first and second isolation regions are shallow trench isolation (STI) regions.

8. The semiconductor device of claim 1, wherein said first and second isolation regions are local oxidation of silicon (LOCOS) regions.

9. The semiconductor device of claim 2, wherein said second isolation region having said gate region overlying it is formed adjacent a drain disposed in said drain region.

10. The semiconductor device of claim 2, wherein said high voltage region includes a PMOS device, and wherein said one of the second isolation regions is in the P well of said PMOS device.

11. The semiconductor device of claim 2 wherein said high voltage region includes a NMOS device, wherein said one of the second isolation regions is in the N well of said NMOS device.

12. The semiconductor device of claim 1, and further comprising:
at least one low voltage transistor device formed in said low voltage device region having a gate region, wherein said gate region comprises a gate oxide, wherein the thickness of said gate oxide is less than 40 angstroms.

13. The semiconductor device of claim 1, and further comprising:

at least one low voltage transistor device formed in said low voltage device region, wherein the gate length of said low voltage transistor device is less than 0.2 micrometers.

14. A semiconductor device, comprising:

a semiconductor substrate;

first isolation regions formed into said substrate in a low voltage device region and having sidewalls, the angle between the sidewalls of the isolation regions and vertical being a first transition angle;

second isolation regions formed into said substrate in a high voltage device region and having sidewalls, the angle between the sidewalls of the second isolation regions and vertical being a second transition angle which is greater than said first transition angle; and at least one high voltage transistor device formed in said high voltage device region having a source region, a drain region and a gate region, wherein said gate region particularly overlies one of said second isolation regions, wherein said drain region comprises one of said second isolation regions, wherein the substrate surface at the top corner of said one of second isolation regions is a substantially rounded shape.

15. The semiconductor device of claim 13, wherein the distance the gate region overlies one of said second isolation regions is smaller than 3 micrometers.

16. The semiconductor device of claim 13, wherein said second transition angle is greater than about 40 degrees.

17. The semiconductor device of claim 13, wherein the difference between said first and second transition angles are greater than about 25 degrees.

18. A semiconductor device, comprising:

a semiconductor substrate;

first isolation regions formed into said substrate in a low voltage device region and having sidewalls, the angle between the sidewalls of the isolation regions and vertical being a first transition angle; and second isolation regions formed into said substrate in a high voltage device region and having sidewalls, the angle between the sidewalls of the second isolation regions and vertical being a second transition angle which is greater than said first transition angle and further comprising a trench oxide;

at least one high voltage transistor device formed in said high voltage device region having a source region, a drain region and a gate region, wherein said gate region partially overlies one of said second isolation regions, wherein said drain region comprises one of said second isolation regions, wherein said gate region comprise a gate dielectric, wherein top surface height in the trench oxide of said second isolation regions is substantially higher than interface of said substrate and said gate dielectric of said high voltage device.

19. The semiconductor device of claim 18, wherein the top surface height difference between trench oxide of said second isolation regions and the interface of said substrate and said gate dielectric of said high voltage device is greater than about 50 angstroms.

20. The semiconductor device of claim 18, wherein the top surface height difference between the trench oxide of said second isolation regions and interface of said substrate and said gate dielectric of said high voltage device is greater than about 100 angstroms.

21. The semiconductor device of claim 18, wherein the difference between said first and second transition angles is greater than about 25 degrees.

* * * * *